(12) United States Patent
Chen et al.

(10) Patent No.: US 10,183,227 B2
(45) Date of Patent: Jan. 22, 2019

(54) ELECTRONIC BUILDING BLOCK SET WITH METAL LAYER ON OUTER SURFACE OF EACH BUILDING BLOCK

(71) Applicant: Yu-Wei Chen, New Taipei (TW)

(72) Inventors: Yu-Wei Chen, New Taipei (TW); Lin-Yu Kao, Taipei (TW)

(73) Assignee: Yu-Wei Chen, New Taipei (TW)

( * ) Notice: Subject to any disclaimer, the term of this patent is extended or adjusted under 35 U.S.C. 154(b) by 0 days.

(21) Appl. No.: 15/886,884

(22) Filed: Feb. 2, 2018

(65) Prior Publication Data

US 2018/0236368 A1 Aug. 23, 2018

(30) Foreign Application Priority Data

Feb. 18, 2017 (TW) ............... 106202397 U

(51) Int. Cl.
| | |
|---|---|
| H05K 1/18 | (2006.01) |
| A63H 33/04 | (2006.01) |
| H05K 1/14 | (2006.01) |
| H02J 50/10 | (2016.01) |
| H05K 1/11 | (2006.01) |
| G09B 23/18 | (2006.01) |
| A63H 33/08 | (2006.01) |

(52) U.S. Cl.
CPC ........... *A63H 33/042* (2013.01); *A63H 33/08* (2013.01); *G09B 23/185* (2013.01); *H02J 50/10* (2016.02); *H05K 1/115* (2013.01); *H05K 1/144* (2013.01); *H05K 1/18* (2013.01); *H05K 2201/10037* (2013.01); *H05K 2201/1056* (2013.01); *H05K 2201/10151* (2013.01); *H05K 2201/10515* (2013.01)

(58) Field of Classification Search
CPC ...... A63H 33/00; A63H 33/04; A63H 33/042; A63H 33/086
USPC ........................... 446/85, 91, 484, FOR. 000
See application file for complete search history.

(56) References Cited

U.S. PATENT DOCUMENTS

| 4,894,040 A * | 1/1990 | Bach ................... A63H 33/042 385/147 |
| 6,902,461 B1 * | 6/2005 | Munch ................ A63H 33/042 446/85 |
| 7,942,717 B2 * | 5/2011 | Chou ..................... G06T 17/10 446/122 |

(Continued)

*Primary Examiner* — Kien Nguyen
(74) *Attorney, Agent, or Firm* — Bacon & Thomas, PLLC

(57) ABSTRACT

An electronic building block set with a metal layer on the outer surface of each building block includes a main and an auxiliary building block. The top of the main building block includes plural main hollow posts, each with a main sensing contact, and has a main metal layer on the outer surface. The main sensing contacts and the main metal layer are electrically connected to opposite-polarity main electrode circuits respectively. The bottom of the auxiliary building block includes a first sensing element and has an auxiliary metal layer on the outer surface. The first sensing element and the auxiliary metal layer are electrically connected to opposite-polarity auxiliary electrode circuits respectively. When the building blocks are engaged, the first sensing element is electrically connected to the corresponding main sensing contact, and the auxiliary metal layer, to the main metal layer to enable electricity or signal transmission between the building blocks.

23 Claims, 3 Drawing Sheets

(56) References Cited

U.S. PATENT DOCUMENTS

| | | | | |
|---|---|---|---|---|
| 8,079,890 | B2* | 12/2011 | Seligman | A63H 33/086 |
| | | | | 446/118 |
| 8,651,913 | B1* | 2/2014 | Lin | A63H 33/042 |
| | | | | 446/91 |
| 2004/0185745 | A1* | 9/2004 | Reining | A63H 33/042 |
| | | | | 446/91 |
| 2011/0021107 | A1* | 1/2011 | Nag | A63H 33/042 |
| | | | | 446/91 |
| 2011/0143629 | A1* | 6/2011 | Seymour | A63H 33/04 |
| | | | | 446/91 |
| 2011/0263177 | A1* | 10/2011 | Lemchen | A63H 33/04 |
| | | | | 446/87 |
| 2014/0273711 | A1* | 9/2014 | Capriola | A63H 33/042 |
| | | | | 446/91 |
| 2015/0072585 | A1* | 3/2015 | Lin | A63H 33/042 |
| | | | | 446/91 |

* cited by examiner

ELECTRONIC BUILDING BLOCK SET WITH METAL LAYER ON OUTER SURFACE OF EACH BUILDING BLOCK

FIELD OF THE INVENTION

The present invention relates to an electronic building block set. More particularly, the invention relates to an electronic building block set in which each building block has a metal layer on the outer surface and a sensing contact in each of its hollow posts, and in which the metal layer and sensing contacts of each building block are electrically connectable to electrode circuits of opposite polarities respectively.

BACKGROUND OF THE INVENTION

Electronic building blocks are building blocks provided therein with electronic components of different functions such as capacitors, resistors, inductors, and light-emitting diodes. Serving now as a fun teaching aid to encourage learning, they are stackable in various ways so that children can learn the principles of circuitry through the stacking process. In earlier times, however, electronic building blocks were viewed only as a variation of solderless breadboards and therefore were not designed as "smart devices". Most of the former electronic building blocks were capable only of transmitting electricity, meaning they were provided therein with metal conductive components to be connected when a plurality of such blocks are stacked to transmit electricity sequentially through the blocks.

Seeing that the electricity-transmitting building blocks had very limited functions, The Lego Group of Denmark and the Massachusetts Institute of Technology (MIT) of the USA jointly developed "MINDSTORMS", an electronic building block product that includes the "brain" building block RCX, a sensing system (e.g., sensors for sensing such external environment factors as light, temperature, and touch), an infrared communication element, and 700 conventional Lego building blocks. A user can code a software program using a personal computer, transmit the program to the "brain" building block RCX through the infrared communication element, and thereby save the program into the "brain" building block RCX, which is then electrically connected to the sensing system and mounted with the conventional Lego building blocks to form a robot of the desired configuration, in order for the robot to operate according to the user's program and execute the corresponding procedures.

However, the applicant of the present patent application has found that additional transmission lines are required to connect the "brain" building block RCX to the components mounted thereon in order to transmit signals and electricity therebetween. If pulled by accident during operation or while the robot is played with, the transmission lines may break, causing the "brain" building block RCX to malfunction, whose repairment can be costly and time-consuming. The applicant has also found that the "brain" building block RCX as well as a conventional electronic building block capable only of electric power transmission has its contacts for positive-electrode circuits and its contacts for negative-electrode circuits provided on the same circuit board, and that therefore specific assembly modes are essential for proper transmission of electricity but result in difficulties in assembly and hence inconvenient of use. That is to say, while the conventional electronic building blocks advantageously integrate education into fun activities, they still have limitations in use. The issue to be addressed by the present invention is to solve the foregoing problems effectively and provide better user experience.

BRIEF SUMMARY OF THE INVENTION

In view of the fact that the existing electronic building blocks still leave room for improvement, the inventor of the present invention conducted extensive research and tests based on years of practical experience in the industry and, after continual improvements, finally succeeded in developing an electronic building block set with a metal layer on the outer surface of each building block. It is hoped that the invention contributes effectively to enhancing user experience in assembling and playing electronic building blocks.

One objective of the present invention is to provide an electronic building block set in which the outer surface of each building block is provided with a metal layer. The electronic building block set includes a main building block and an auxiliary building block. The main building block is provided therein with at least one main circuit board. The main circuit board includes two main electrode circuits that are opposite in polarity (e.g., a positive-electrode circuit and a negative-electrode circuit). The main electrode circuits are configured to receive electricity of opposite polarities respectively. The main building block has a top portion protrudingly provided with a plurality of main hollow posts. Each of the main hollow posts has a bottom portion provided with a main sensing contact, and all the main sensing contacts are electrically connected to one of the main electrode circuits. The outer surface of the top portion of the main building block is coated with a main metal layer, which is electrically connected to the other main electrode circuit. The auxiliary building block is mounted therein at least with an auxiliary circuit board. The auxiliary circuit board includes two auxiliary electrode circuits that are opposite in polarity. The auxiliary building block has a bottom portion protrudingly provided with at least one first sensing element, and the outer surface of the bottom portion of the auxiliary building block is coated with a first auxiliary metal layer. The first sensing element is electrically connected to one of the auxiliary electrode circuits while the first auxiliary metal layer is electrically connected to the other auxiliary electrode circuit. When the auxiliary building block is engaged with the main building block, the first sensing element extends into the corresponding main hollow post and is electrically connected to the corresponding main sensing contact, and the first auxiliary metal layer is pressed against the main metal layer, allowing the auxiliary circuit board to receive electricity from the main building block. By arranging the connecting portions of the positive-electrode circuit of the main building block (i.e., the main sensing contacts) and the connecting portion of the negative-electrode circuit of the main building block (i.e., the main metal layer) in different areas of the main building block respectively, the auxiliary building block is allowed to be assembled to the main building block in various directions.

BRIEF DESCRIPTION OF THE SEVERAL VIEWS OF THE DRAWINGS

The above and other objectives, as well as the technical features and their effects, of the present invention can be better understood by referring to the following detailed description of some illustrative embodiments of the invention in conjunction with the accompanying drawings, in which.

DETAILED DESCRIPTION OF THE INVENTION

The present invention provides an electronic building block set in which the outer surface of each building block is provided with a metal layer. In one embodiment of the invention, referring to FIG. 1 and FIG. 2, the electronic building block set at least includes a main building block 1 and an auxiliary building block 2. It is worth mentioning that the main building block 1 and the auxiliary building block 2 of the present invention may be identical in shape to the conventional building blocks (e.g., those manufactured by The Lego Group) or shaped according to design requirements so as to be rectangular, square, circular, or otherwise. The main building block 1 is provided therein with at least one main circuit board 10 and a battery 12. The main circuit board 10 includes two main electrode circuits that are opposite in polarity, such as a positive-electrode circuit and a negative-electrode circuit. The main electrode circuits are electrically connected to the two opposite-polarity electrode contacts (i.e., the positive-electrode contact and the negative-electrode contact) of the battery 12 respectively. In other words, the positive-electrode circuit is connected to the positive-electrode contact, and the negative-electrode circuit, to the negative-electrode contact. It should be pointed out that providing the main circuit board 10 with a positive-electrode circuit and a negative-electrode circuit and connecting the two electrode circuits respectively to the positive- and negative-electrode contacts of the battery 12 are well known in the art, and that therefore a person of ordinary skill in the art who fully understands the technical features of the present invention may adjust the aforesaid circuit configuration as appropriate.

Figure 1:
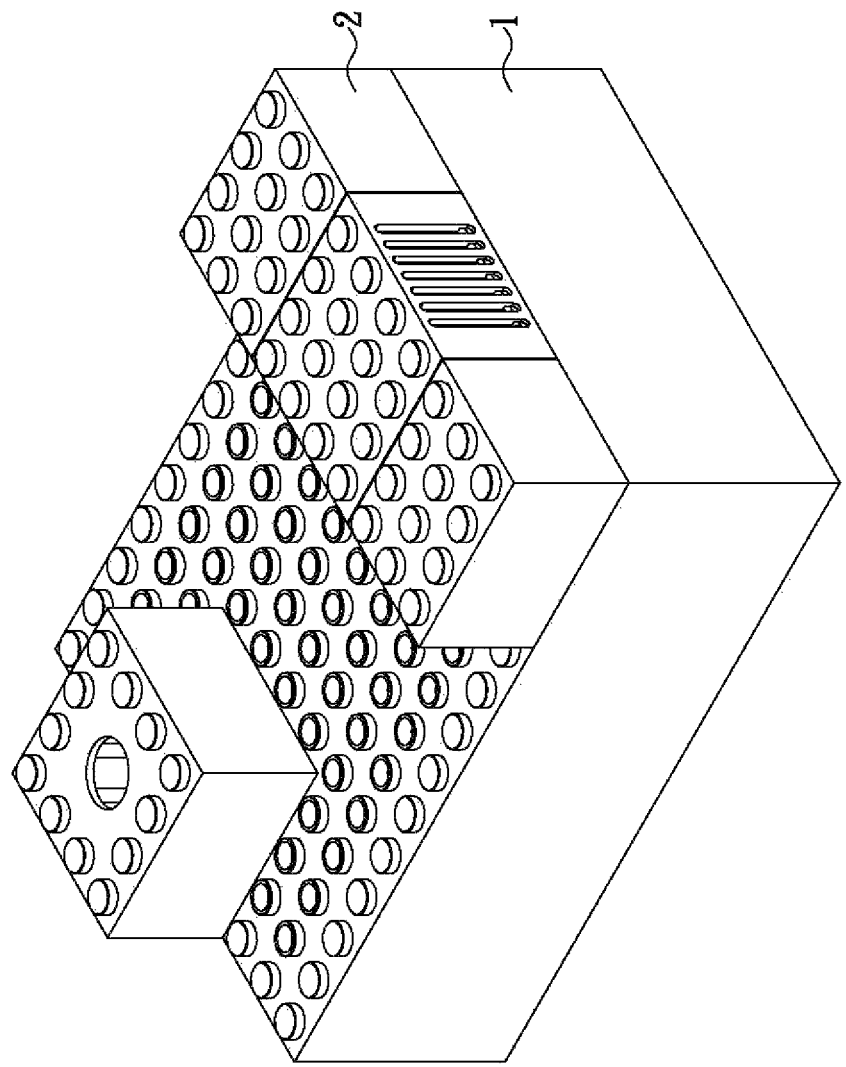
FIG. 1 is an assembled perspective view of an electronic building block set.
Figure 2:
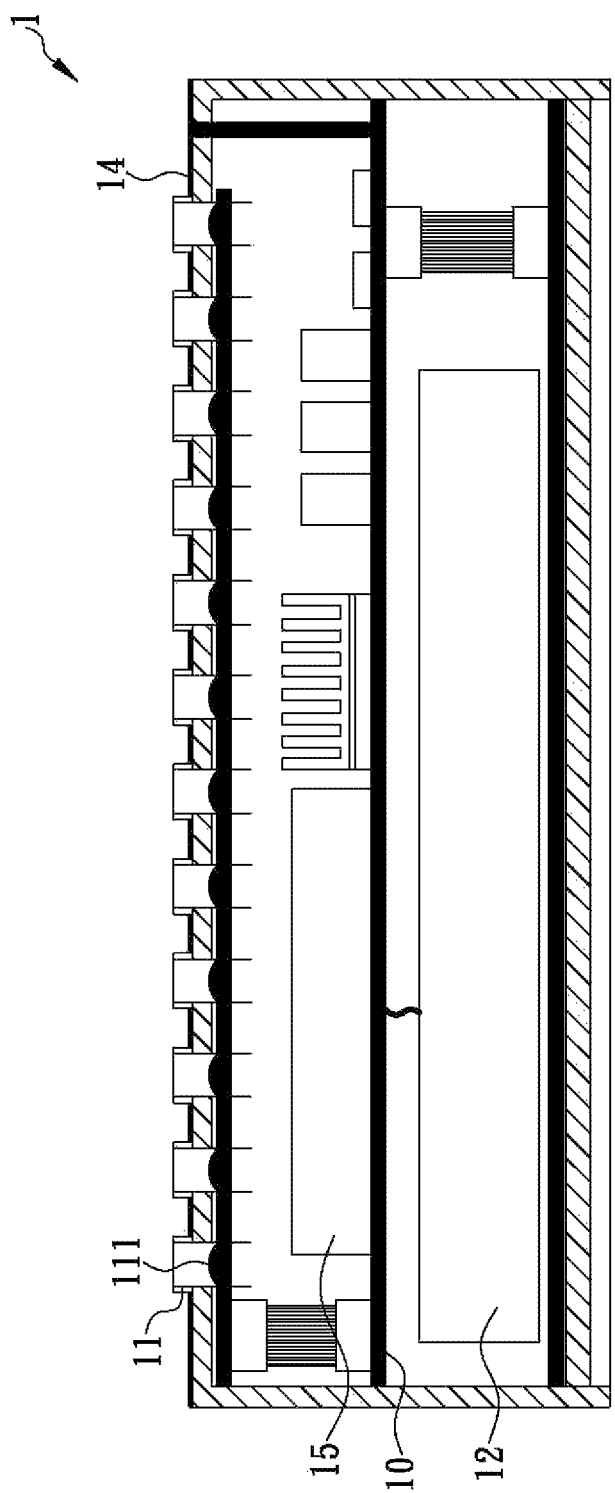
FIG. 2 is a sectional view of a main building block.

In this embodiment, with continued reference to FIG. 1 and FIG. 2, the main building block 1 has a top portion protrudingly provided with a plurality of main hollow posts 11. Each main hollow post 11 has a bottom portion provided with a main sensing contact 111. The main sensing contacts 111 are illustrated in FIG. 2 as forming a metal dome array but in other embodiments may be adjusted in configuration to meet product requirements. The main sensing contacts 111 are electrically connected to one of the main electrode circuits (e.g., the positive-electrode circuit) in order to receive electricity from the positive-electrode contact of the battery 12. The outer surface of the top portion of the main building block 1 is coated with a main metal layer 14, which may be formed on the main building block 1 by electroplating, adhesive bonding, vapor deposition, or other methods. The main metal layer 14 is electrically connected to the other main electrode circuit (e.g., the negative-electrode circuit). Thus, the main electrode circuits to which the main sensing contacts 111 and the main metal layer 14 are respectively electrically connected are of opposite polarities respectively.

Figure 3:
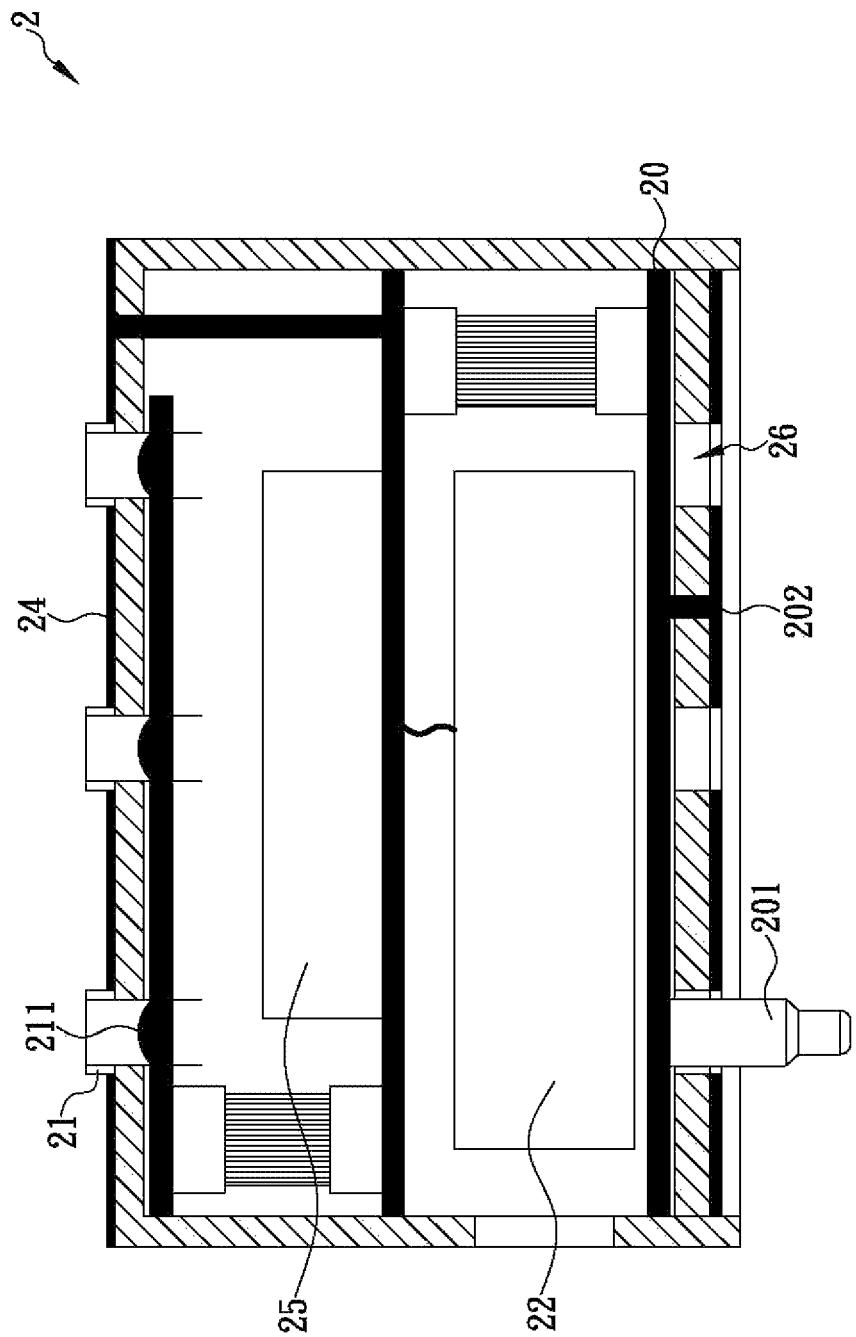
FIG. 3 is a sectional view of an auxiliary building block.

In this embodiment, referring to FIG. 1 and FIG. 3, the auxiliary building block 2 is mounted therein at least with an auxiliary circuit board 20. The auxiliary circuit board 20 includes two auxiliary electrode circuits that are opposite in polarity, such as a positive-electrode circuit and a negative-electrode circuit. The auxiliary building block 2 has a bottom portion protrudingly provided with at least one first sensing element 201. The first sensing element 201 is illustrated in FIG. 3 as a pogo pin but in other embodiments may be adjusted in configuration to meet product requirements. The first sensing element 201 is electrically connected to one of the auxiliary electrode circuits (e.g., the positive-electrode circuit) in order to receive electricity from that auxiliary electrode circuit. The outer surface of the bottom portion of the auxiliary building block 2 is coated with a first auxiliary metal layer 202, which is electrically connected to the other auxiliary electrode circuit (e.g., the negative-electrode circuit). Thus, the auxiliary electrode circuits to which the first sensing element 201 and the first auxiliary metal layer 202 are respectively electrically connected are of opposite polarities respectively. It should be pointed out that FIG. 3 depicts the connection between the first sensing element 201, the first auxiliary metal layer 202, and the auxiliary circuit board 20 only schematically; the first sensing element 201 and the first auxiliary metal layer 202 do not form a short circuit.

Referring to FIG. 1 to FIG. 3, when the auxiliary building block 2 is engaged with the main building block 1 (as shown in FIG. 1), the first sensing element 201 extends into the corresponding main hollow post 11 and is electrically connected to the corresponding main sensing contact 111, and the first auxiliary metal layer 202 is electrically connected to the main metal layer 14. Consequently, a loop is formed, allowing the auxiliary circuit board 20 to receive electricity from the battery 12 in the main building block 1. As the connecting portions of the positive-electrode circuit of the main building block 1 (i.e., the main sensing contacts 111) are in a different area from the connecting portion of the negative-electrode circuit of the main building block 1 (i.e., the main metal layer 14), and the connecting portion of the positive-electrode circuit of the auxiliary building block 2 (i.e., the first sensing element 201) is in a different area from the connecting portion of the negative-electrode circuit of the auxiliary building block 2 (i.e., the first auxiliary metal layer 202), circuit design is made much easier than with the conventional electronic building blocks, in which the aforesaid connecting portions of each building block are confined in the same area (e.g., on the same circuit board). Moreover, the auxiliary building block 2 can be mounted at any position on the top portion of the main building block 1, without regard to which hollow posts correspond to the positive-electrode circuit and which hollow posts correspond to the negative-electrode circuit, the distinction, however, being necessary in the case of a conventional building block.

In this embodiment, referring back to FIG. 1 to FIG. 3, the main sensing contacts 111 are on a lower horizontal level than the main metal layer 14 because the former are located at the bottom portions of the main hollow posts 11 while the latter lies on the outer surface of the top portion of the main building block 1. To adapt to the foregoing structure of the main building block 1, the length of the first sensing element 201 is greater than the thickness of the first auxiliary metal layer 202 (i.e., the bottom end of the first sensing element 201 is on a lower horizontal level than the first auxiliary metal layer 202), allowing the first sensing element 201 to extend into the corresponding main hollow post 11 and be pressed against the corresponding main sensing contact 111, and the first auxiliary metal layer 202 to be pressed against the main metal layer 14. When the auxiliary building block 2 is mounted at a wrong position such that the first sensing element 201 is pressed against the main metal layer 14, the first auxiliary metal layer 202, which is on a higher horizontal level than the main metal layer 14 and the main sensing contacts 111, is kept from contact, and hence from forming a short circuit, with the main metal layer 14 or the main sensing contacts 111. This enhances the safety of use greatly.

In this embodiment, with continued reference to FIG. 2 and FIG. 3, the bottom portion of the auxiliary building block 2 is concavely provided with a plurality of auxiliary grooves 26, each configured to engage with any one of the main hollow posts 11 so that the auxiliary building block 2 can engage with the main building block 1 through engagement between the corresponding auxiliary grooves 26 and main hollow posts 11. Also, the top portion of the auxiliary building block 2 in this embodiment is protrudingly provided with a plurality of auxiliary hollow posts 21, and each auxiliary hollow post 21 has a bottom portion provided with an auxiliary sensing contact 211. The auxiliary sensing contacts 211, which may form a metal dome array as shown in FIG. 3, are electrically connected to one of the auxiliary electrode circuits (e.g., the positive-electrode circuit) of the auxiliary circuit board 20. The outer surface of the top portion of the auxiliary building block 2 is coated with a second auxiliary metal layer 24, which is electrically connected to the other auxiliary electrode circuit (e.g., the negative-electrode circuit). It should be pointed out that the auxiliary building block 2 may be provided therein with a plurality of circuit boards that are connected by ribbon cables or other cables to form the auxiliary circuit board 20 in the present invention. This multiple-circuit-board design allows a user to stack a plurality of auxiliary building blocks 2 into predetermined shapes such as cars, buildings, boats, and robots. By the same token, referring back to FIG. 2, the main circuit board 10 in another embodiment of the invention may be formed by electrically connecting a plurality of circuit boards, and the main building block 1 may be additionally provided with sensing elements, a metal layer, grooves, and so forth in a bottom portion so that the auxiliary building block 2 can be mounted on not only the top portion but also the bottom portion of the main building block 1, thereby increasing the flexibility of use of the electronic building block set of the present invention.

In this embodiment, referring to FIG. 1 to FIG. 3, the main building block 1 is further provided therein with a main microprocessor 15. The main microprocessor 15 is electrically connected to the main circuit board 10 and is configured to receive electricity from the battery 12. The auxiliary building block 2, on the other hand, is provided therein with an auxiliary microprocessor 25 and at least one function module 22 (e.g., a loudspeaker, a microphone, a Bluetooth module, or a camera module). The auxiliary microprocessor 25 and the function module 22 are electrically connected to the auxiliary circuit board 20 separately. Once the auxiliary building block 2 is engaged with the main building block 1 to form electrical connection therebetween through the first sensing element 201, the corresponding main sensing contact 111, the first auxiliary metal layer 202, and the main metal layer 14, the components in the auxiliary building block 2 (e.g., the auxiliary microprocessor 25 and the function module 22) can receive electricity from the battery 12. In addition, the auxiliary microprocessor 25 may receive a control signal from the main microprocessor 15 and, based on the control signal, instruct the function module 22 to perform the corresponding procedure (e.g., making a sound or recording moving images). In another embodiment of the present invention, the auxiliary building block 2 may be provided with only the function module 22 but not the auxiliary microprocessor 25. In that case, the function module 22 may be configured to either operate (e.g., emit light, or record or reproduce a sound) on its own when supplied with electricity or perform the corresponding procedure after receiving the control signal directly from the main microprocessor 15.

In other embodiments of the present invention, referring to FIG. 1 to FIG. 3, the battery 12 may be provided in the auxiliary building block 2 instead so that, once the auxiliary building block 2 is engaged with the main building block 1, the electricity in the battery 12 in the auxiliary building block 2 can be transmitted through the first sensing element 201, the corresponding main sensing contact 111, the first auxiliary metal layer 202, and the main metal layer 14 to the components in the main building block 1 (e.g., the main microprocessor 15). In the meantime, the components in the auxiliary building block 2 (e.g., the auxiliary microprocessor 25 and the function module 22) can receive electricity directly from the battery 12. If the auxiliary building block 2 is provided therein only with the battery 12 and the function module 22, the function module 22 can perform the corresponding procedure upon receiving electricity from the battery 12. If the auxiliary building block 2 is provided therein with the battery 12, the function module 22, and the auxiliary microprocessor 25, the auxiliary microprocessor 25 can, when the auxiliary building block 2 is engaged with the main building block 1, receive the control signal from the main microprocessor 15 and then instruct the function module 22 to perform the corresponding procedure.

Apart from the foregoing embodiments, wireless power transfer can be incorporated into the present invention so that the main building block and the auxiliary building block need not be provided with batteries but have electricity-receiving devices on their respective circuit boards. More specifically, each electricity-receiving device has two electrode contacts that are opposite in polarity and are connected to the corresponding electrode circuits (e.g., the main electrode circuits or the auxiliary electrode circuits) respectively. A user only has to place the main building block or the auxiliary building block on a battery with an electricity-transmitting device, and the electricity-transmitting device will convert the electricity of the battery into a specific form of energy (e.g., an electric field, a magnetic field, or electromagnetic waves) in order for the electricity-receiving device to receive the energy from the electricity-transmitting device. The electricity-receiving device will then convert the energy into electricity and transmit the electricity through its electrode contacts to such structures as the main electrode circuits, the main sensing contacts, the main metal layer, the first sensing element, the first auxiliary metal layer, and the auxiliary electrode circuits, thereby achieving electric power transmission. That is to say, a battery may be provided inside or outside the main building block or the auxiliary building block, and the transmission of electricity may be carried out in a wired or wireless manner, provided that the main electrode circuits or the auxiliary electrode circuits can receive electricity of opposite polarities.

While the invention herein disclosed has been described by means of specific embodiments, numerous modifications and variations could be made thereto by those skilled in the art without departing from the scope of the invention set forth in the claims.

What is claimed is:

1. An electronic building block set with a metal layer on an outer surface of each building block, comprising:
   a main building block provided therein with at least one main circuit board, wherein the main circuit board comprises two main electrode circuits respectively of opposite polarities, the main building block has a top portion protrudingly provided with a plurality of main hollow posts, each of the main hollow posts has a bottom portion provided with a main sensing contact, the main sensing contacts are electrically connected to one of the main electrode circuits, the top portion of the main building block has an outer surface coated with a main metal layer, and the main metal layer is electrically connected to the other main electrode circuit such that the main electrode circuits to which the main sensing contacts and the main metal layer are respectively electrically connected are of the opposite polarities respectively; and an auxiliary building block mounted therein at least with an auxiliary circuit board, wherein the auxiliary circuit board comprises two auxiliary electrode circuits respectively of the opposite polarities; the auxiliary building block has a bottom portion protrudingly provided with at least one first sensing element; the bottom portion of the auxiliary building block has an outer surface coated with a first auxiliary metal layer; the first sensing element is electrically connected to one of the auxiliary electrode circuits, and the first auxiliary metal layer is electrically connected to the other auxiliary electrode circuit such that the auxiliary electrode circuits to which the first sensing element and the first auxiliary metal layer are respectively electrically connected are of the opposite polarities respectively; and when the auxiliary building block is engaged with the main building block, the first sensing element extends into a corresponding one of the main hollow posts and is electrically connected to a corresponding one of the main sensing contacts, the polarity of the auxiliary electrode circuit to which the first sensing element corresponds is identical to the polarity of the main electrode circuit to which the main sensing contacts correspond, the first auxiliary metal layer is electrically connected to the main metal layer, and the polarity of the auxiliary electrode circuit to which the first auxiliary metal layer corresponds is identical to the polarity of the main electrode circuit to which the main metal layer corresponds.

2. The electronic building block set of claim 1, further comprising a battery, wherein the battery is provided in the main building block and has two electrode contacts respectively of the opposite polarities, the main electrode circuits are electrically connected to the electrode contacts of the battery respectively, and each said electrode contact and the main electrode circuit electrically connected thereto are of the same polarity.

3. The electronic building block set of claim 2, wherein the auxiliary building block has a top portion protrudingly provided with a plurality of auxiliary hollow posts, each of the auxiliary hollow posts has a bottom portion provided with an auxiliary sensing contact, the auxiliary sensing contacts are electrically connected to one of the auxiliary electrode circuits, the top portion of the auxiliary building block has an outer surface coated with a second auxiliary metal layer, and the second auxiliary metal layer is electrically connected to the other auxiliary electrode circuit such that the auxiliary electrode circuits to which the auxiliary sensing contacts and the second auxiliary metal layer are respectively electrically connected are of the opposite polarities respectively.

4. The electronic building block set of claim 3, wherein the bottom portion of the auxiliary building block is concavely provided with a plurality of auxiliary grooves, and each of the auxiliary grooves is configured to engage with any of the main hollow posts so that the auxiliary building block is engageable with the main building block through engagement between the auxiliary grooves and the main hollow posts.

5. The electronic building block set of claim 4, wherein the auxiliary building block further comprises at least one function module, and the function module is electrically connected to the auxiliary circuit board and performs a corresponding procedure upon receiving electricity.

6. The electronic building block set of claim 4, wherein the main building block further comprises a main microprocessor; the auxiliary building block further comprises an auxiliary microprocessor and at least one function module; the main microprocessor is electrically connected to the main circuit board; the auxiliary microprocessor and the function module are electrically connected to the auxiliary circuit board separately; and when the auxiliary building block is engaged with the main building block, the auxiliary microprocessor receives a control signal from the main microprocessor and instructs the function module to perform a corresponding procedure.

7. The electronic building block set of claim 4, wherein the two main electrode circuits are a positive-electrode circuit and a negative-electrode circuit, the main sensing contacts are electrically connected to the positive-electrode circuit, and the main metal layer is electrically connected to the negative-electrode circuit.

8. The electronic building block set of claim 7, wherein the two auxiliary electrode circuits are a positive-electrode circuit, to which the first sensing element is electrically connected, and a negative-electrode circuit, to which the auxiliary metal layer is electrically connected.

9. The electronic building block set of claim 1, further comprising a battery, wherein the battery is provided in the auxiliary building block and has two electrode contacts respectively of the opposite polarities, the auxiliary electrode circuits are electrically connected to the electrode contacts of the battery respectively, and each said electrode contact and the auxiliary electrode circuit electrically connected thereto are of the same polarity.

10. The electronic building block set of claim 9, wherein the auxiliary building block has a top portion protrudingly provided with a plurality of auxiliary hollow posts, each of the auxiliary hollow posts has a bottom portion provided with an auxiliary sensing contact, the auxiliary sensing contacts are electrically connected to one of the auxiliary electrode circuits, the top portion of the auxiliary building block has an outer surface coated with a second auxiliary metal layer, and the second auxiliary metal layer is electrically connected to the other auxiliary electrode circuit such that the auxiliary electrode circuits to which the auxiliary sensing contacts and the second auxiliary metal layer are respectively electrically connected are of the opposite polarities respectively.

11. The electronic building block set of claim 10, wherein the bottom portion of the auxiliary building block is concavely provided with a plurality of auxiliary grooves, and each of the auxiliary grooves is configured to engage with any of the main hollow posts so that the auxiliary building block is engageable with the main building block through engagement between the auxiliary grooves and the main hollow posts.

12. The electronic building block set of claim 11, wherein the auxiliary building block further comprises at least one function module, and the function module is electrically connected to the auxiliary circuit board and performs a corresponding procedure upon receiving electricity.

13. The electronic building block set of claim 11, wherein the main building block further comprises a main microprocessor; the auxiliary building block further comprises an auxiliary microprocessor and at least one function module; the main microprocessor is electrically connected to the main circuit board; the auxiliary microprocessor and the function module are electrically connected to the auxiliary circuit board separately; and when the auxiliary building block is engaged with the main building block, the auxiliary microprocessor receives a control signal from the main microprocessor and instructs the function module to perform a corresponding procedure.

14. The electronic building block set of claim 11, wherein the two main electrode circuits are a positive-electrode circuit and a negative-electrode circuit, the main sensing contacts are electrically connected to the positive-electrode circuit, and the main metal layer is electrically connected to the negative-electrode circuit.

15. The electronic building block set of claim 14, wherein the two auxiliary electrode circuits are a positive-electrode circuit, to which the first sensing element is electrically connected, and a negative-electrode circuit, to which the auxiliary metal layer is electrically connected.

16. The electronic building block set of claim 1, further comprising an electricity-receiving device, wherein the electricity-receiving device uses a wireless power transfer method to receive energy from an electricity-transmitting device and convert the energy into electricity, the electricity-receiving device is provided in the main building block and has two electrode contacts respectively of the opposite polarities, the main electrode circuits are electrically connected to the electrode contacts of the electricity-receiving device respectively, and each said electrode contact and the main electrode circuit electrically connected thereto are of the same polarity.

17. The electronic building block set of claim 1, further comprising an electricity-receiving device, wherein the electricity-receiving device uses a wireless power transfer method to receive energy from an electricity-transmitting device and convert the energy into electricity, the electricity-receiving device is provided in the auxiliary building block and has two electrode contacts respectively of the opposite polarities, the auxiliary electrode circuits are electrically connected to the electrode contacts of the electricity-receiving device respectively, and each said electrode contact and the auxiliary electrode circuit electrically connected thereto are of the same polarity.

18. The electronic building block set of claim 1, wherein the auxiliary building block has a top portion protrudingly provided with a plurality of auxiliary hollow posts, each of the auxiliary hollow posts has a bottom portion provided with an auxiliary sensing contact, the auxiliary sensing contacts are electrically connected to one of the auxiliary electrode circuits, the top portion of the auxiliary building block has an outer surface coated with a second auxiliary metal layer, and the second auxiliary metal layer is electrically connected to the other auxiliary electrode circuit such that the auxiliary electrode circuits to which the auxiliary sensing contacts and the second auxiliary metal layer are respectively electrically connected are of the opposite polarities respectively.

19. The electronic building block set of claim 18, wherein the bottom portion of the auxiliary building block is concavely provided with a plurality of auxiliary grooves, and each of the auxiliary grooves is configured to engage with any of the main hollow posts so that the auxiliary building block is engageable with the main building block through engagement between the auxiliary grooves and the main hollow posts.

20. The electronic building block set of claim 19, wherein the auxiliary building block further comprises at least one function module, and the function module is electrically connected to the auxiliary circuit board and performs a corresponding procedure upon receiving electricity.

21. The electronic building block set of claim 19, wherein the main building block further comprises a main microprocessor; the auxiliary building block further comprises an auxiliary microprocessor and at least one function module; the main microprocessor is electrically connected to the main circuit board; the auxiliary microprocessor and the function module are electrically connected to the auxiliary circuit board separately; and when the auxiliary building block is engaged with the main building block, the auxiliary microprocessor receives a control signal from the main microprocessor and instructs the function module to perform a corresponding procedure.

22. The electronic building block set of claim 19, wherein the two main electrode circuits are a positive-electrode circuit and a negative-electrode circuit, the main sensing contacts are electrically connected to the positive-electrode circuit, and the main metal layer is electrically connected to the negative-electrode circuit.

23. The electronic building block set of claim 22, wherein the two auxiliary electrode circuits are a positive-electrode circuit, to which the first sensing element is electrically connected, and a negative-electrode circuit, to which the auxiliary metal layer is electrically connected.

* * * * *